United States Patent
Fogarty et al.

(10) Patent No.: US 12,154,978 B2
(45) Date of Patent: Nov. 26, 2024

(54) PROCESSOR ELEMENT FOR QUANTUM INFORMATION PROCESSOR

(71) Applicant: QUANTUM MOTION TECHNOLOGIES LIMITED, Harrogate (GB)

(72) Inventors: Michael Fogarty, London (GB);
Matthew Schormans, London (GB);
John Morton, London (GB)

(73) Assignee: QUANTUM MOTION TECHNOLOGIES LIMITED, London (GB)

( * ) Notice: Subject to any disclaimer, the term of this patent is extended or adjusted under 35 U.S.C. 154(b) by 402 days.

(21) Appl. No.: 17/611,428

(22) PCT Filed: May 12, 2020

(86) PCT No.: PCT/GB2020/051151
§ 371 (c)(1),
(2) Date: Nov. 15, 2021

(87) PCT Pub. No.: WO2020/229808
PCT Pub. Date: Nov. 19, 2020

(65) Prior Publication Data
US 2022/0336648 A1 Oct. 20, 2022

(30) Foreign Application Priority Data
May 16, 2019 (GB) ..................... 1906934

(51) Int. Cl.
*H01L 29/76* (2006.01)
*G06N 10/40* (2022.01)
(Continued)

(52) U.S. Cl.
CPC ......... *H01L 29/7613* (2013.01); *G06N 10/40* (2022.01); *H01L 29/42368* (2013.01); *H01L 29/66439* (2013.01); *H01L 29/66977* (2013.01)

(58) Field of Classification Search
CPC .... G06N 10/40; G06N 10/00; H01L 29/7613; H01L 29/42368; H01L 29/66439;
(Continued)

(56) References Cited

U.S. PATENT DOCUMENTS

2019/0043955 A1* 2/2019 George ................ H01L 29/157

FOREIGN PATENT DOCUMENTS

JP 10261790 A 9/1998
JP 2011114156 A 6/2011
(Continued)

OTHER PUBLICATIONS

Angus et al. Gate defined Quantum dots in Intrinsic Silicon Nano Letters vol. 7 No. 7 2051-2055 2007 (Year: 2007).*
(Continued)

*Primary Examiner* — Matthew L Reames
(74) *Attorney, Agent, or Firm* — Fletcher Yoder, P.C.

(57) ABSTRACT

Processor elements are described herein. A processor element comprises a silicon layer. The processor element further comprises one or more conductive electrodes. The processor element further comprises dielectric material having a non-uniform thickness, the dielectric material disposed at least between the silicon layer and the one or more conductive electrodes. In use, when a bias potential is applied to one or more of the conductive electrodes, the positioning of the one or more conductive electrodes and the non-uniform thickness of the dielectric material together define an electric field profile to induce a quantum dot at an interface between the silicon layer and the dielectric layer. Methods are also described herein.

16 Claims, 5 Drawing Sheets

(51) Int. Cl.
*H01L 29/423* (2006.01)
*H01L 29/66* (2006.01)

(58) Field of Classification Search
CPC ........... H01L 29/66977; H01L 29/0653; H01L 29/0673; H01L 29/4232; H01L 29/66984
See application file for complete search history.

(56) References Cited

FOREIGN PATENT DOCUMENTS

| | | | |
|---|---|---|---|
| TW | 201617283 | A | 5/2016 |
| WO | 2017213660 | A1 | 12/2017 |
| WO | 2018063270 | A1 | 4/2018 |
| WO | 2018044268 | A1 | 8/2018 |

OTHER PUBLICATIONS

TW Search Report for TW Application No. 109116253, Mailed Sep. 11, 2023, 1 page.
Kim, "Couple parallel quantum dots in silicon-on-insulator metal-oxide-semiconductor field-effect transistors," Jan. 2, 2006, Seoul, South Korea, Physica E, pp. 273-279.

* cited by examiner

PROCESSOR ELEMENT FOR QUANTUM INFORMATION PROCESSOR

FOREIGN PRIORITY INFORMATION

This application claims priority to PCT application number PCT/GB2020/051151, filed May 12, 2020, which claims priority to United Kingdom patent application number 1906934.3, filed May 16, 2019.

TECHNICAL FIELD

The present disclosure relates to processor elements for use in quantum information processing. In particular, the present application relates to processor elements which use confinement regions such as quantum dots to store charge carriers for use as qubits, and which are manufacturable by complementary-metal-oxide-semiconductor manufacturing processes.

BACKGROUND

The invention described herein is, at least in part, based on quantum mechanics, quantum information and quantum computation. For the interested reader, the fundamentals are detailed in "Quantum Computation and Quantum Information" by Michael A Nielsen and Isaac L Chuang. In particular, this reference contains properties of qubits and the basics of quantum measurements in complementary bases, and provides an introduction to quantum error correction and fault-tolerant quantum computing. This reference also familiarises readers with notations conventionally used in the field of quantum physics.

A quantum computer is a device that processes quantum information, which is a generalisation of classical information (such as discrete classical bits i.e. 0's and 1's) which classical computers process. A quantum computer has the potential to be far more powerful than a classical computer for at least some processes because many operations can be performed much more efficiently.

In a computer for the processing of quantum bits, otherwise known as "qubits", each qubit can be placed in one of two states. However, due to the nature of quantum bits, they can also be placed in a superposition of these two states. If every qubit of a computer is placed in a suitable superposition of states, the overall superposition of states in the computer scales as $2^m$ where m is the number of qubits. By placing a computer in this superposition of states, quantum algorithms can be used to solve various problems much more rapidly. This can be viewed as resulting from the fact that, rather than running through each possible state sequentially, the qubits are in all possible combinations of states at the same time. While a qubit may be thought of as a classical 0, a classical 1, or a superposition of the two states, a qubit may be thought of as a 0, 1, . . . , d−1 or a superposition of any of the d states.

Universal quantum computers promise a speed-up of processing times for several operations such as factoring large numbers, search algorithms, and quantum simulations, yet the progress of development of such quantum computers is hindered by the required high precision of control of the quantum states, and the difficulty in scaling up quantum computers to be able to process a large number of qubits or qudits.

The present disclosure provides processor devices, architectures and apparatuses capable of mitigating some of the problems described above.

SUMMARY

As described above, there is a long sought desire to build universal quantum computers, but many obstacles stand in the way of creating a universal quantum computer. In particular, a major obstacle to the development of quantum computers is decoherence—unintended interactions of a quantum state with the external world leads to a loss of quantum information. Quantum error correction can be used to protect quantum information from errors due to decoherence and other sources of noise. One can, in effect, construct a logical qubit from a plurality of physical qubits, such that the logical qubit can be processed with more precision than any individual physical qubit.

A second major obstacle to building quantum computers is scalability. While several competing architectures exist for implementing qubits, such as ion trap architectures and superconducting qubit architectures, it is very difficult to build devices which can sustain more than a few qubits. Many of the most-promising approaches to large scale universal quantum computing rely upon quantum error correction, in which an ideal logical qubit can be simulated by using a plurality of (noisy) physical qubits provided that the errors are below a fault-tolerance threshold. Such approaches require an architecture that can be scaled up to very large numbers of qubits. It will prove difficult to achieve a large scale quantum computer with any architectures that cannot be adequately scaled up to operate reliably with large numbers of physical qubits.

The inventors have recognised that if a quantum computing architecture can be manufactured using complementary-metal-oxide-semiconductor (CMOS) processes then there is a likelihood that such architectures can be scaled up to include many physical qubits.

The elements/architectures/designs described herein may form the basic building blocks for a spin-qubit quantum processor which can be fabricated using existing CMOS technologies, for example a 40 nm CMOS process. Such processes typically limit the materials, certain dimensions and fabrication methods used in the production of the device, but their highly developed and well-controlled nature means that complex devices can be produced with very high yield and high uniformity on a very large scale and at relatively low cost. However, due to the process restrictions, many inventive steps are required to produce suitable spin-qubit building blocks using this technology. While the principle of CMOS compatibility is often assumed, for example because of the materials used, the reality is that other complexities in the scale or patterning of the devices renders them incompatible with a standard CMOS process. For example, the small feature sizes and pitches mean some designs can only be fabricated using electron beam lithography. Patterning metal regions with only nanometres between distinct regions is extremely challenging using standard CMOS manufacturing processes. Furthermore, when attempting to fit many quantum processor elements into a small space, there are many difficulties involved in interfacing with the control electronics. In formulating the architectures described herein, the inventors have "broken" many of the standard design rules for CMOS manufacturing processes.

Localised spins in semiconductors can be used to encode elementary bits of quantum information. Silicon (Si) quantum dots (QDs) are promising candidates for the realization of spin qudits. Metallic regions, such as gates, which help to define the quantum dot structure, can be realized by patterning a metal layer on a substantially uniform thickness dielectric layer to separate the metal from the silicon semiconducting region. The quantum dots are conventionally defined through the combined electrostatic potential of several such gates. This creates problems, such as how to get signals to the many gates by fanning out metal connections from the small metal gate regions to the electrode regions for interfacing with classical control electronics. The more quantum dot regions in the processor, the larger the difficulty this presents, and so making a scalable array of thousands of quantum dots, as would be needed for a quantum computer, remains a significant challenge, and the described examples help to mitigate such problems.

According to an aspect of the invention, a processor element is provided herein. The processor element comprises a silicon layer. The processor element further comprises one or more conductive electrodes. The processor element further comprises dielectric material having a non-uniform thickness, the dielectric material disposed at least between the silicon layer and the one or more conductive electrodes. In use, when a bias potential is applied to one or more of the conductive electrodes, the positioning of the one or more conductive electrodes and the non-uniform thickness of the dielectric material together define an electric field profile to induce a quantum dot at an interface between the silicon layer and the dielectric layer.

Advantageously, the processor elements described herein enable gates and the tunnel barriers between them to be defined without the requirement of precision patterning of the metal or doped polysilicon layers. Instead, the electrostatic field profile required to confine an electron to a region (e.g. a quantum dot) may be provided by depositing a top gate of, for example, polysilicon over a dielectric layer of varying (non-uniform) thickness. Accordingly, the processor elements described herein are easier to manufacture than other designs, although many traditional design rules for CMOS manufacturing are broken in the process.

Throughout this specification, reference is made to directional terms such as "above" and "below", or "upper" and "lower". References made to such terms are purely indicative of relative positions of the features of embodiments disclosed herein. For example, if it is mentioned that an electrode is above a dielectric layer and a silicon layer is below the dielectric layer, then it should be understood that the electrode and silicon layer are formed on opposite sides of the dielectric layer. That is, directional terms such as those described herein do not refer to a direction relative to a viewpoint of an observer, but instead should be considered in all aspects as relative terms.

Furthermore, in what follows cartesian axes have been used to define the relative orientation and positioning of components. In particular, an x-axis and a y-axis have been used to describe a horizontal planar coordinate system, and a z-axis has been used to describe a "vertical" direction. The skilled person would understand that the use of such axes is for explanatory purposes only and is to aid the reader in understanding the structure of several processor elements described herein. The axes are not to in any way limit the scope of the present invention.

The dielectric materials may vary in thickness between a maximum thickness and a minimum thickness. The minimum thickness may be less than half the maximum thickness and greater than 1 nm. The maximum thickness may be considered as the "thick oxide thickness" in the CMOS process and the minimum thickness may be considered as the "thin oxide thickness" in the CMOS process. The thick oxide in the CMOS process is exemplarily used to provide isolation between electrodes and contacts and other conducting features, providing a very high level of isolation. The thin oxide in the CMOS process is exemplarily used to separate a gate electrode from the silicon substrate, allowing an electric field to penetrate the silicon substrate and may have a thickness of between 1-10 nm changing from a thin oxide to a thick oxide in a short lateral distance (e.g. <40 nm) is conventionally discouraged, breaking CMOS "design rules", this is because the thick oxide will not be fully formed and so would not provide good isolation. However, for the purposes of the present disclosure, the thick oxide region is used simply to reduce the electric field that penetrates the silicon substrate so this design rule can be broken and a region of "intermediate" thickness oxide is formed where the thick oxide is defined.

The silicon layer may have a non-uniform thickness. For example, a silicon layer may be etched such that trenches/channels in the silicon layer can be filled with the dielectric material, such that the dielectric material has a non-uniform thickness.

The one or more conductive electrodes may have a non-uniform thickness. For example, the one or more conductive electrodes may be shaped such that grooves in the electrodes may be filled with the dielectric material.

The processor may further comprise a source electrode. The processor element may further comprise a drain electrode. The one or more conductive electrodes may comprise one or more gate electrodes. The induced quantum dot may provide a single electron transistor, SET, island. Accordingly, the processor element may comprise a single electron transistor.

The processor element may comprise a source electrode and/or drain electrode, and the quantum dot may be separated from the source and/or the drain by a quantum tunnelling barrier.

The quantum dot may be suitable for confining an electron or a hole for use as a qubit. In this way, a CMOS processor element may be used as a processor of quantum information.

The one or more conductive electrodes may comprise at least a second electrode. In use, when a bias potential is applied to the second conductive electrode, the positioning of the one or more conductive electrodes and the non-uniform thickness of the dielectric material may together define an electric field profile to induce a second quantum dot at a second interface between the silicon layer and the dielectric layer.

The distance between the conductive electrode and the second conductive electrode may be between 10 nm and 140 nm. For example, the distance may be between 30 nm and 60 nm. For example, the distance may be between 40 nm and 50 nm.

The interface and the second interface may be distinct contact points between the silicon layer and the dielectric material. The interface and the second interface may be on the same continuous plane between the dielectric and the silicon layer. The language "second interface" is intended only to refer to a second region defined by a second electrode at which a charged particle may be confined.

The quantum dot and the second quantum dot may be separated by a quantum tunnelling barrier. In this way, control of the first quantum dot may be used to manipulate or read out a spin state of an electron confined in the second quantum dot (or vice versa). The first quantum dot or the second quantum dot may be a SET island.

The second quantum dot may be for defining an electron or a hole for use as a qubit.

The one or more electrodes may comprise doped polysilicon electrodes.

The processor element may be manufacturable using a complementary metal-oxide-silicon manufacturing process.

According to an aspect of the invention, a processor element is provided. The processor element comprises a silicon layer. The processor element comprises two or more conductive electrodes. The processor element further comprises dielectric material having a non-uniform thickness, the dielectric material disposed at least between the silicon layer and the two or more conductive electrodes. In use, when a bias potential is applied to each of the two or more of the conductive electrodes, the positioning of the conductive electrodes and the non-uniform thickness of the dielectric material together define an electric field profile to induce a first quantum dot at an interface between the silicon layer and the dielectric layer and to induce a second quantum dot at a second interface between the silicon layer and the dielectric layer. The first quantum dot is for use as an island of a single electron transistor, and the second quantum dot is for confining a charge carrier for use as a qubit.

According to an aspect of the invention, a quantum information processor is provided, the quantum information processor comprising a plurality of processor elements as described herein.

According to an aspect of the invention, a method of manufacturing a processor element as described herein is provided. The method comprises providing a silicon layer. The method further comprises depositing a dielectric layer upon the silicon layer at least at contact points for conductive electrodes, the dielectric layer formed of a dielectric material. The method further comprises depositing one or more conductive electrodes at contact points upon the dielectric layer. The method further comprises depositing further dielectric material to fill voids beneath the one or more conductive electrodes. Such a manufacturing method does not require the precision patterning of the metal or doped polysilicon layer.

According to an aspect of invention, a method of manufacturing a processor element as described herein is provided. The method comprises providing a silicon layer having a fin. The method further comprises etching trenches in the fin of the silicon layer. The method further comprises depositing a dielectric material upon the silicon layer to fill the etched trenches. The method further comprises depositing one or more conductive electrodes upon the dielectric material.

BRIEF DESCRIPTION OF THE FIGURES

Embodiments of the invention will now be described by way of example only, with reference to the accompanying figures, in which.

Throughout the description and the drawings, like reference numbers refer to like parts.

DETAILED DESCRIPTION

Whilst various embodiments are described below, the invention is not limited to these embodiments, and variations of these embodiments may well fall within the scope of the invention which is to be limited only by the appended claims.

Figure 1A:
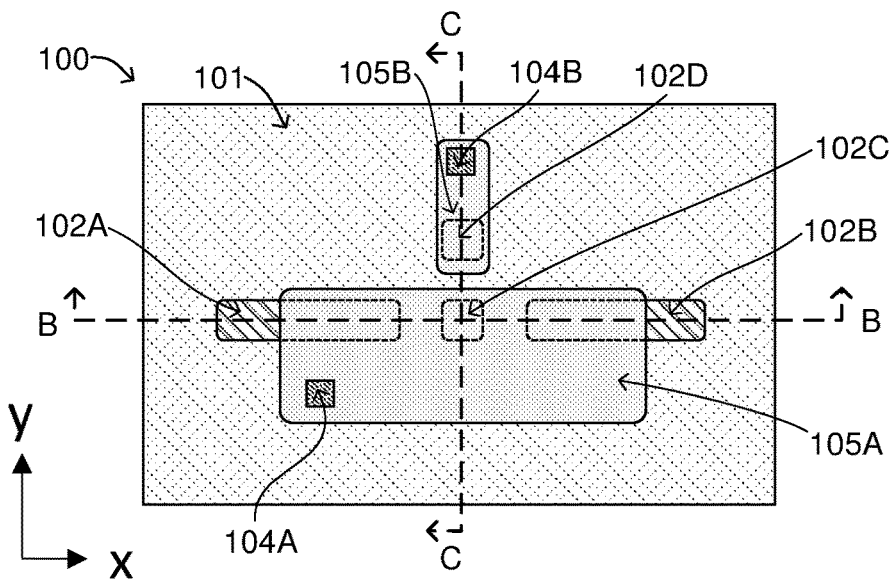
FIG. 1A is a cross-sectional plan view of a processor element.
Figure 1B:
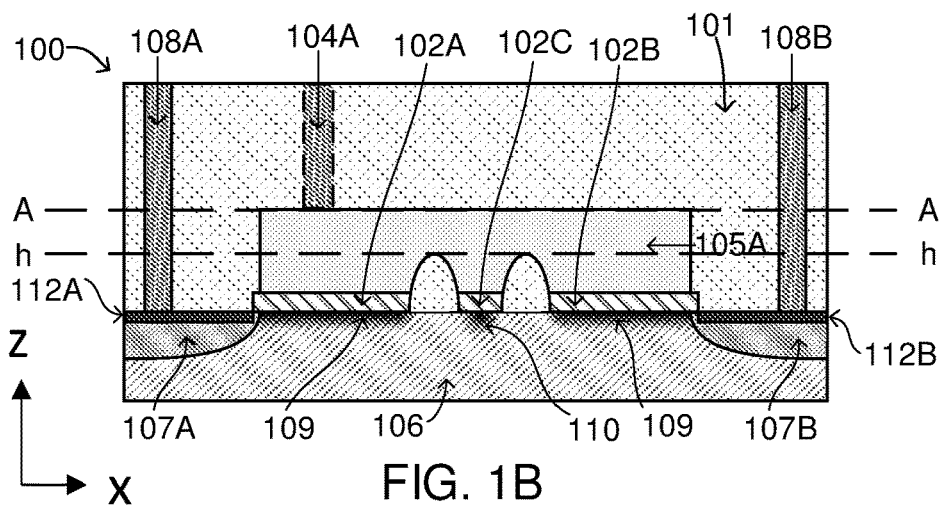
FIG. 1B is a first cross-sectional side view of the processor element of FIG. 1A.
Figure 1C:
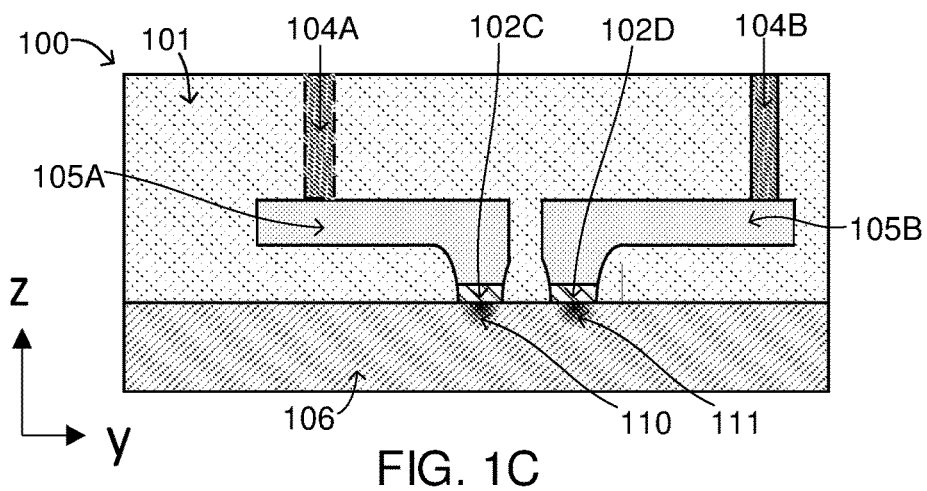
FIG. 1C is a second cross-sectional side view of the processor element of FIG. 1A.

FIGS. 1A-1C depict a processor element 100 according to an example. FIG. 1A shows a cut-through view of the processor element 100 in the x-y plane at a first height along the z-axis. That is, FIG. 1 illustrates the processor element 100 as viewed from above (plan view) at a first height within the processor element 100. In particular, the plan view is at the height shown by line A in FIG. 1B. FIG. 1B shows a cross-sectional view of the processor element 100 as viewed substantially along direction B (shown in FIG. 1A). The source and drain electrodes of FIG. 1B are not shown in FIG. 1A. FIG. 1C shows a second cross-sectional view of the processor element 100 as viewed substantially along direction C (shown in FIG. 1A). Features shown in dashed lines (for example features 104A and 104B in FIGS. 1B and 1C) are shown for indicative purposes only but are obstructed from view.

The processor element 100 of FIGS. 1A-1C may be implemented as a qubit control element for a quantum computer comprising a plurality of these processor elements. As will be explained below, in the processor element 100 of FIGS. 1A-1C, charge carriers such as electrons are able to be confined to small regions of semiconductor (i.e. in a quantum dot) which can be brought into the single electron regime or the few electron regime. The processor element 100 of FIGS. 1A-1C provides two quantum dots, one for use as an island of a single electron transistor (SET), and one for confining a charge carrier for use as a spin qubit.

With reference to FIGS. 1A-1C, the processor element 100 includes a silicon layer 106. The silicon layer may be isotropically enriched. In this example, isotropically enriched silicon $^{28}$Si is used. The $^{28}$Si may be an epitaxial layer grown on a conventional silicon substrate.

The processor element 100 further comprises a metal source electrode 112A and a metal drain electrode 112B, each connected to a corresponding metal via 108A, 108B. Beneath the source electrode 112A there is an ohmic region 107A. Beneath the drain electrode 112B there is an ohmic region 107B. The source/drain regions may be formed by standard CMOS techniques.

The processor element further comprises two conductive polysilicon electrodes, 105A and 105B, each coupled by dedicated vias 104A, 104B to metal routing for fan out to external voltage connections. The polysilicon gate electrodes 105A and 105B are separated from each other by a distance of approximately 40 nm in this example (at the points at which those electrodes come into contact with labelled thin dielectric regions 102C and 102D respectively).

As can be seen in FIGS. 1A-1C, the processor element 100 further comprises regions of thin dielectric material, in particular a first region of thin dielectric material 102A, a second region of thin dielectric material 102B, a third region of thin dielectric material 102C and a fourth region of thin dielectric material 102D. In the present example the dielectric material comprises silicon dioxide ($SiO_2$). In addition to the regions of thin dielectric material 102A-102D the processor element further comprises one or more thicker regions of dielectric material 101, such that the dielectric material in the processor element is of non-uniform thickness. The "thick" dielectric material in the present example also comprises $SiO_2$, but may in embodiments differ from the dielectric material used at positions 102A-102D. That is, the dielectric material used in the thick regions 101 may be the same as the dielectric material 102A-102D, and applied in the same density and at the same stage during manufacture as the thin dielectric regions 102A-102D—the shading and labelling of FIGS. 1A-1C is for indicative purposes only. During manufacture, the thin and thick dielectric regions may be deposited at the same time. That is, a non-uniform dielectric layer may be deposited prior to the provision of the conductive material for the electrodes. As an alternative example, the thin oxide region may be formed first and then the thick oxide region may be grown by deposition through a mask. As a further alternative example. The thick oxide region may be grown first and then masked and selectively etched back to the silicon layer; the thin oxide may then be grown on top.

In this way, processor element 100 comprises dielectric material 101, 102A-102D, such that the dielectric material is disposed at least between the silicon layer 106 and the polysilicon electrodes 105A, 105B and has a varied thickness between the silicon layer 106 and the polysilicon electrodes 105A, 105B. The thickness of the dielectric material at the "thin" locations 102A-102D is approximately 5 nm in this example, but may be up to around 10 nm. The dielectric material vanes in thickness between a maximum and minimum thickness, wherein the minimum thickness is less than half the maximum thickness and greater than 1 nm.

The first and second conductive electrodes, 105A and 105B, accordingly overlay regions of thin dielectric material 102A-102D and regions of thick dielectric material 101. The metal vias 104A and 104B may be used to the hold the conductive electrodes at appropriate bias potentials during operation of the processor element 100.

The dielectric material is of non-uniform thickness in the region between the silicon layer 106 and the first conductive electrode 105A. In particular, there is a first region of thick dielectric material (around 60 nm at its peak height "h" in FIG. 1B) laterally separating the first region of thin dielectric material 102A and the third region of thin dielectric material 102C, and similarly there is a second region of thick dielectric material (around 60 nm at its peak height "h" in FIG. 1B) laterally separating the third region of thin dielectric material 102C and the second region of thin dielectric material 102B. That is, the dielectric material and conductive material for the electrode are shaped so as to form, in use, a non-uniform electrostatic potential at the interface between the dielectric material and the silicon layer. The first region of thin dielectric material 102A and the third region of dielectric material 102C are separated by a distance of around 40 nm. The second region of thin dielectric material 102B and the third region of dielectric material 102C are separated by a distance of around 40 nm.

The skilled person would appreciate that the peak height "h" in FIG. 1B may be up to around 150 nm. The skilled person would appreciate that the separation between the first/second region of the thin dielectric material 102A/102B and the third region of thin dielectric material 102C may be separated by between 10 nm and 140 nm.

By applying a potential to metallic via 104A, regions of induced charge carriers 109 form in the silicon layer 106 at the interface between the silicon layer 106 and the silicon dioxide 102A, 102B and 102C.

When in use, a bias potential may be applied to the first conductive electrode 105A through the first metal via 104. The bias potential may be between −5V and +5V depending on the oxide thickness which governs both allowable range (to breakdown voltage) and useful range (threshold voltage). The application of the bias potential to the first conductive electrode 105A produces an electric field within the processor element. Dielectric material situated between the conductive electrode 105A and the silicon layer 106 reduces the effect of the electric field at the silicon-dielectric boundary. A region of the silicon-dielectric boundary in which thick dielectric is situated between a conductive electrode and the silicon layer 106 will have a reduced electric field effect relative to a region of the boundary at which only thin dielectric material is situated between a conductive electrode and the silicon layer 106. Accordingly, the non-uniform thickness of the dielectric material between the silicon layer 106 and the first polysilicon electrode 105A shapes a non-uniform electrostatic potential at the interface between dielectric material and silicon. The electric field at the first boundary region 109 may be large enough to induce an inversion layer at the boundary. However, the electric field at the interface between silicon and dielectric at the region of induced charge carriers 109 and the quantum dot 110 is reduced substantially due to the region of thick dielectric situated between the silicon layer 106 and the first conductive electrode 105A (as described above). This results in a region in which the electric field at the boundary is not large enough to induce an inversion layer and therefore the dielectric region between the quantum dot 110 and source/drain electrodes acts as a tunnelling barrier. The charge carriers in the inversion layer of the first region 109 must tunnel through the tunnelling barrier in order to reach the induced quantum dot 110. The region 110 at the $Si/SiO_2$ interface is a region in which either electrons or holes may be isolated. If a sufficiently positive potential is applied to a distal end of metal via 104A, then electrons will be caused to be isolated in region 110; whereas if a sufficiently negative potential is applied to the distal end of via 104A, then holes will be caused to be isolated in region 110. In an example, the potential applied to via 104A may be sufficient to isolate a single electron in quantum dot region 110, with quantum tunnelling barriers between the quantum dot 110 and the source and drain electrodes 112A, 112B. In this way, a single electron transistor (SET) is formed.

The single electron transistor accordingly comprises a SET island 110 formed in the silicon layer 106 between tunnelling junctions connected to the source and the drain electrodes, the tunnelling between the SET island 110 controlled by the potentials applied to gate electrode 105A. Through tunnelling, one can add or subtract electrons to/from the SET island 110 charging it either negatively or positively.

The presence of excess electrons at the SET island 110 affects the electrostatic energy of the system, which depends on the charging energy of the SET:

$$E_{charge} = \frac{1}{2} \frac{Q_{island}}{C}$$

where $Q_{island}$ and is the charge on the island given by ne where n is the number of excess electrons and e is the charge of one electron, and C is the total capacitance of the SET island 110. The total capacitance C of the SET island 110 includes the intrinsic capacitances of the tunnelling junctions to the source and drain electrodes and the gate capacitance as controlled by the electrode 105A.

The electrostatic energy of the SET is given approximately by $$E_{SET} = \frac{1}{2} \frac{e^2(n - n_{gate})^2}{C}$$

where $n_{gate}$ is the number of elementary gate charges. The electrostatic energy of the SET determines whether tunnelling through a junction is forbidden or allowed at a given potential difference between the source and drain electrodes. This is the Coulomb blockade effect. The drain-source voltage determines the energy of the electrons before the junction—when the voltage is higher that the Coulomb blockade, the electrons will overcome the blockade and tunnelling will occur. The height of the blockade may be determined by the number of excess electrons on the SET island 110 and the gate charge.

The coupling between the SET island and the source/drain is set via the potential bias applied to the conductive electrode 105A and the proximity of the third region of thin dielectric material 102C to the first region of thin dielectric material 102A and the second region of thin dielectric material 102B. The potential bias applied to the first conductive electrode 105A tunes the electrochemical potential of the dot region such that one or more electrons is confined at the SET island 110. Typically the SET island may confine between 10 and 100 electrons.

FIG. 1C depicts a cross-section of the processor element in the y-z plane (along dashed-line C in FIG. 1B). The fourth region of thin dielectric material 102D is situated between the silicon layer 106 and the second conductive electrode 105B. The dielectric material between the silicon layer 106 and the first and second conductive electrodes 105A, 105B may have a non-uniform thickness, such that the thickness of dielectric material (between the first or second conductive electrode and the silicon layer) varies with y-coordinate. The first conductive electrode 105A and the second conductive electrode 105B are separated laterally by a region of thick dielectric material, wherein the thickness may again vary with y-coordinate between the first and second conductive electrodes. The first and second conductive electrodes are separated by a distance of 40 nm in this example, although the skilled person would appreciate that any suitable distance would suffice, for example between 10 nm and 140 nm. A second quantum dot 111 may be defined at the boundary between the silicon layer 106 and the fourth region of thin dielectric material 102D.

A potential bias may be applied to the second conductive electrode 105B through the second metal via 104B. The application of a potential bias to the first conductive electrode 105A and the second conductive electrode 105B, in combination with the thick region of dielectric material laterally separating the first conductive electrode 105A and second conductive electrode 105B results in a tunnelling barrier between the quantum dot 110 (SET island 110) and the second quantum dot 111. The potential biases of the conductive electrodes may be tuned such that charge carriers may tunnel through the tunnelling barrier from the SET island 110 to the second quantum dot 111. The potential biases may be tuned such that the electric field confines a single electron to the second quantum dot 111, such that the electron may be used as a qubit. The SET island 110 and the qubit in quantum dot 111 may be capacitively coupled due to their proximity.

Accordingly, processor element 100 comprises a SET having a first quantum dot (acting as the SET island 110), and a proximally located second quantum dot 111 for confining an electron for use as a spin qubit. The SET island 110 can be manipulated in order to read out the qubit stored in quantum dot 111. The occupancies of the two quantum dots 110 and 111 are controlled by the voltages applied to vias 104A and 104B and can be tuned so as to confine relatively small numbers N of electrons to the quantum dots. In a simple scenario, each quantum dot 110, 111 carries a spin of $S=\frac{1}{2}$ when the occupancy N is odd, and a spin of $S=0$ when the occupancy N is even. Tunnelling between the SET island 110 and the quantum dot 111 is dependent on the Pauli spin-blockade mechanism. In particular, when the spins in the SET island 110 and the quantum dot 111 are the same, then tunnelling between the two regions is forbidden by the Pauli exclusion principle. If, on the other hand, the spins in the SET island 110 and the quantum dot 111 are not the same, then tunnelling may be enabled to occur. The difference in current flow between the source and the drain electrodes enables a user to distinguish between the two states. In particular, the total capacitance C at the SET island 110 is dependent on the state of the spin qubit held in the second quantum dot 111, and accordingly a state of the spin qubit in the second quantum dot 111 can be determined by analysing the drain-source voltage required to overcome the electrostatic energy of the SET.

The quantum dots 110, 111 are accordingly defined by the combined electrostatic potential of electrodes 105A and 105B, and the non-uniform thickness of the dielectric material.

The processor element 100 may be formed by any suitable manufacturing process, such as a 40 nm CMOS process. For example, a silicon layer 106 may be provided. A thick oxide layer 101 may be provided upon the silicon layer 106, and the thick oxide layer 101 may be etched so as to provide spacing for the conductive vias and electrodes, the conductive vias separated from the silicon layer 106 by a remaining thin oxide layer 102A-102D. The conducting vias and electrodes may be inserted into the spacings formed in the thick oxide layers.

Figure 2A:
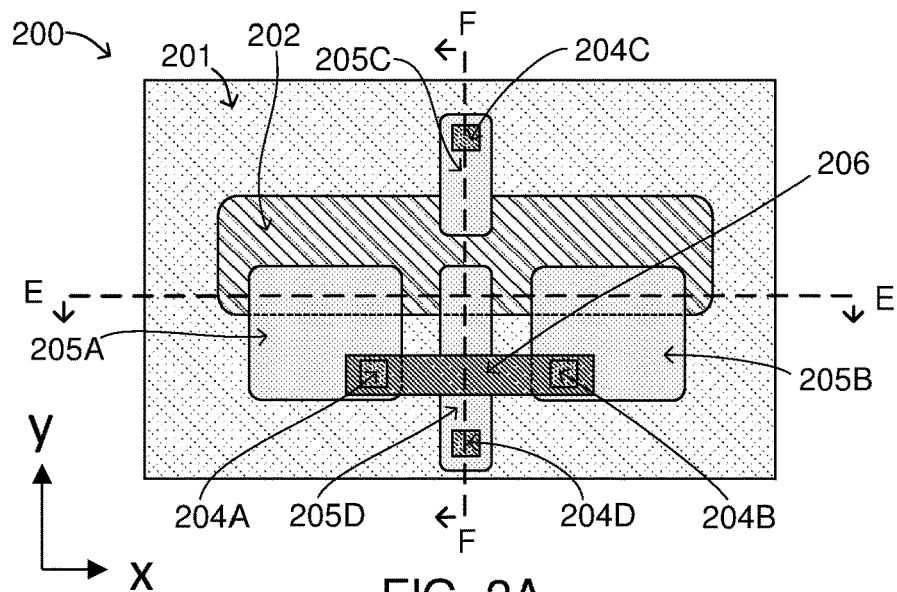
FIG. 2A is a cross-sectional plan view of a processor element.
Figure 2B:
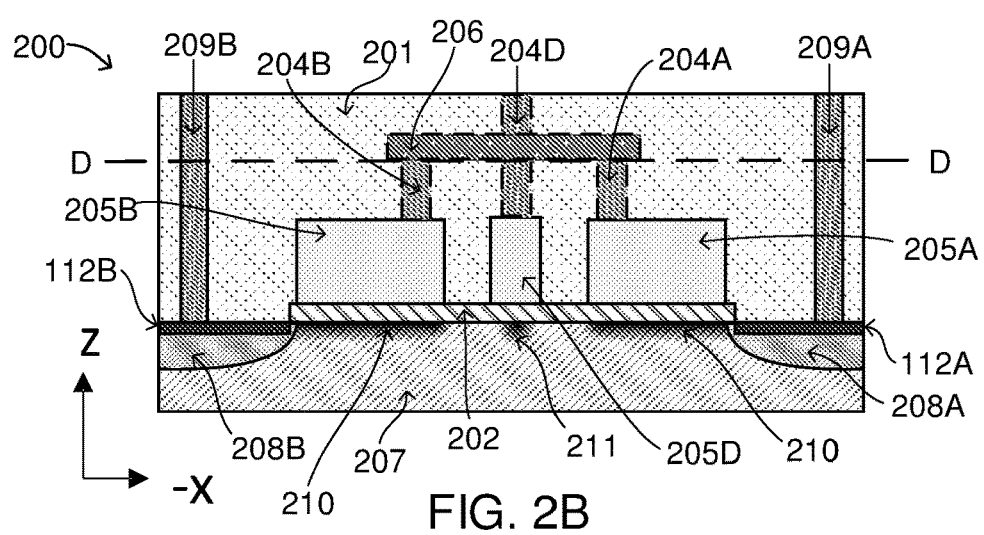
FIG. 2B is a first cross-sectional side view of the processor element of FIG. 2A.
Figure 2C:
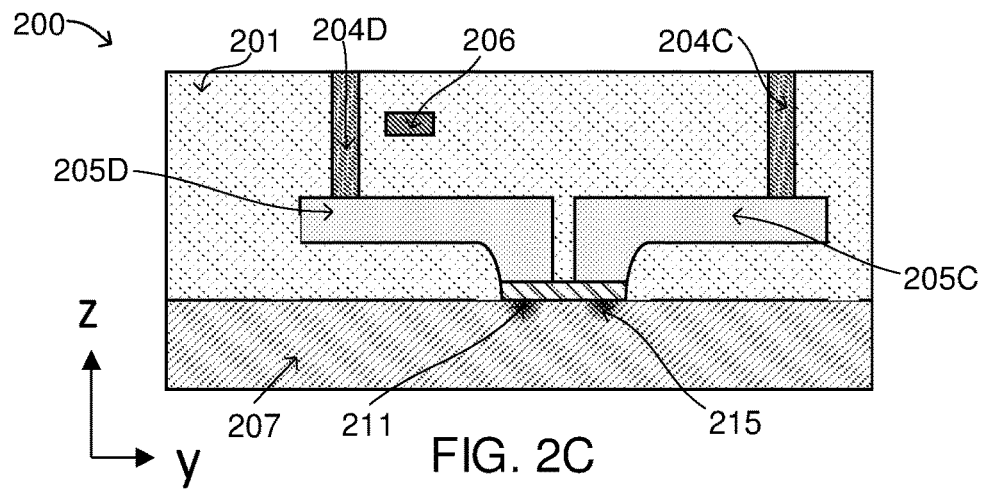
FIG. 2C is a second cross-sectional side view of the processor element of FIG. 2A.

FIGS. 2A-2C illustrate a processor element 200 according to another example of the present disclosure from several vantage points. FIG. 2A shows a cut-through view of the processor element 200 in the x-y plane at a first height along the z-axis. That is, FIG. 2A illustrates a cross-section of the processor element 200 as viewed from above (plan view) at a first height within the processor element 200, in particular a height as indicated by line D in FIG. 2B. FIG. 2B shows a cross-sectional view of the processor element as viewed substantially along direction E (shown in FIG. 2A). FIG. 2C shows a cross-sectional view of the processor element 200 as viewed substantially along direction F (shown in FIG. 2A). The source and drain electrodes of FIG. 2B are not shown in FIG. 2A.

With reference to FIGS. 2A-2C, the processor element includes a silicon layer 207, one or more conductive electrodes 205A-205D, and a region of thin dielectric material 202. In addition to the region of thin dielectric material 202 there exists regions of thick dielectric material 201, such that the dielectric material in the processor element is of non-uniform thickness. The dielectric material 201 is disposed at least between the silicon layer 207 and the one or more conductive electrodes 205A-205D.

The processor element shown in FIGS. 2A-2C advantageously induces (in use) better defined quantum dot regions due to the use of a patterned polysilicon boundary at the transition between thin and thick oxide regions.

FIG. 2A depicts a first conductive electrode 205A, a second conductive electrode 205B, a third conductive electrode 205C and a fourth conductive electrode 205D in addition to a region of thin dielectric material 202 and thick dielectric material 201. The thin region of dielectric material 202 is surrounded by regions of thicker dielectric material 201, wherein the thickness of the thicker dielectric material 201 is not necessarily uniform. The dielectric material has non-uniform thickness in the z-direction (i.e. out of the plane of the page). The thin region of dielectric material may be referred to as gate layer or gate region of dielectric material. The thin and thick regions of dielectric material may be comprised of the same dielectric material and the dielectric material may be silicon oxide. The region of thin dielectric material may be formed within the processor element by etching a region of thick dielectric material. The first, second, third and fourth conductive electrodes at least partially overlay regions of thin dielectric material and regions thick dielectric material. The conductive electrodes may be formed of polysilicon.

A first end of a first metal via 204A is connected to the first conductive electrode 205A and the second end of the first metal via 204A is connected to a metallic crossbar 206. Similarly, a first end of a second metal via 204B is connected to the second conductive electrode 205B and a second end of the second metal via 204B is connected to the metallic crossbar 206. A third metal via 204C is connected to the third conductive electrode 205C and a fourth metal via 204D is connected to the fourth conductive electrode 205D. The metal vias may be used to the hold the conductive electrodes at a bias potentials during the operation of the processor element. As the first metal via 204A and the second metal via 204B are connected to the same metallic crossbar 206 they are both held at the same potential. The third metal via 204C and the fourth metal via 204D may be held independently at the same potential bias or a different potential bias.

FIG. 2B depicts a cross-section in the x-z plane of the processor element (along dashed-line E in FIG. 2A). FIG. 2B further depicts, within the silicon layer, a metallic source electrode 212A, and a metallic drain electrode 212B, with ohmic regions 208A and 208B formed beneath the electrodes in the silicon layer. The source electrode 212A and drain electrode 212B are respectively connected to a fifth metal via 209A and sixth metal via 209B.

The first conductive electrode 205A, second conductive electrode 205B and fourth conductive electrode 205D are separated from the silicon layer 207 by the thin region of dielectric material 202 and separated from each other laterally in the x-direction by regions of thick dielectric material. The dielectric material is of non-uniform thickness in the z-direction, alternating between regions of thin dielectric material 202 and sufficiently thick dielectric material to separate the conductive electrodes. The conductive electrodes are separated by a distance of 100 nm-150 nm (which is in the range of the thickness of the thick oxide layer).

The boundary between the region of thin dielectric material 202 and the silicon layer 207 in the regions proximal to the first conductive electrode 205A and the second conductive electrode 205B can be considered to be a first boundary region 210. The boundary between the region of thin dielectric material 202 and the silicon layer 207 proximal to the fourth conductive electrode 205D can be considered to be a second boundary region, or quantum dot 211.

When in use, bias potentials may be applied to the first conductive electrode 205A, the second conductive electrode 205B and the fourth conductive electrode 205D through the first metal via 204A, the second metal via 204B and the fourth metal via 204D, respectively, wherein the first metal via 204A and the second metal via 204B are connected to the same metal crossbar 206. The skilled person would appreciate that the first metal via 204A and the second metal via 204B need not be connected to the same metal crossbar 206. As with the example of FIGS. 1A-1C, the bias potential may be between −5V and +5V.

The application of the bias potential to the conductive electrodes produces an electric field within the processor element. Dielectric material situated between the conductive electrodes and the silicon layer 207 may act to reduce the effect of the electric field at the silicon-dielectric boundary. A region of the silicon-dielectric boundary in which thick dielectric is situated between a conductive electrode and the silicon layer 207 will have a reduced electric field effect relative to a region of the boundary at which only thin dielectric material is situated between a conductive electrode and the silicon layer 207. In this way, a region of induced charge carriers 210 may be formed in the silicon layer 207 near to the source and drain electrodes. At the $Si/SiO_2$ interface beneath electrode 205D a quantum dot 211 may be induced.

As with the example describe in relation to FIGS. 1A-1C, the processor element 200 of FIGS. 2A-2C includes a SET. In particular, the quantum dot 211 acts as a SET island between the source electrode 212A and the drain electrode 212B. Advantageously, the processor 200 allows for the size of the SET island 211 to be controlled by electrode 205D independently of the potentials applied to electrodes 205A and 205B.

FIG. 2C depicts a cross-section of the processor element 200 in the y-z plane (along dashed-line F in FIG. 2A). The region of thin dielectric material 202 may be situated between the silicon layer 207 and both the third conductive electrode 205C and fourth conductive electrode 205D. The dielectric material between the silicon layer 207 and the third and fourth conductive electrodes may have a non-uniform thickness, such that the thickness of dielectric material (between the third or fourth conductive electrode and the silicon layer) varies with y-coordinate. The third conductive electrode 205C and the fourth conductive electrode 205D are separated laterally by around 40 nm (but optionally between 10 nm and 140 nm) in the y-direction by a region of thick dielectric material. A second quantum dot 215 may be induced at the interface between the silicon layer 207 and the region of thin dielectric material 202 at a location proximal to the quantum dot 211.

A potential bias may be applied to the third conductive electrode 205C through the third metal via 204C. The application of a potential bias to the first, second and fourth conductive electrodes in combination with the region of thick dielectric material laterally separating the third conductive electrode 205C and fourth conductive electrode 205D results in a tunnelling barrier between the first quantum dot 211 (or SET island 211) and the second quantum dot 215. The potential biases of the conductive electrodes may be tuned such that charge carriers may tunnel through the tunnelling barrier from the SET island 211 to the second quantum dot 215. The potential biases may be tuned such that the electric field confines a single electron to the third boundary region 215, such that the second quantum dot may store an electron for use as a spin-qubit.

The SET shown in FIG. 2C and the SET island 211 may be utilised as a read-out device for measuring the quantum state of the qubit in quantum dot 215 by measuring the coupling (for example, capacitive coupling) between the SET island 211 and the qubit of quantum dot 215 as described above in relation to FIGS. 1A-1C.

Figure 3A:
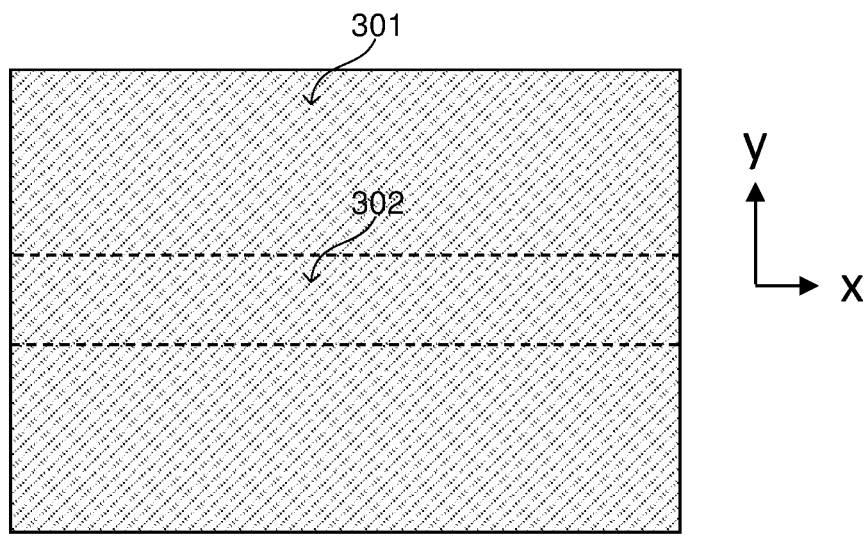
FIG. 3A illustrates a FIN field effect transistor (FET) nanowire from a first angle.
Figure 3B:
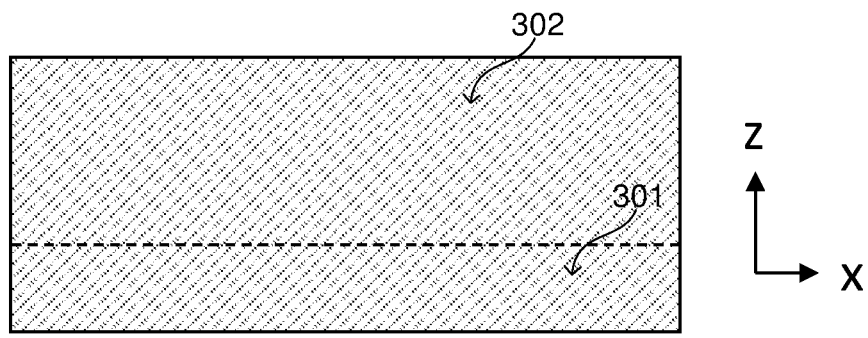
FIG. 3B illustrates a FINFET nanowire from a second angle.
Figure 3C:
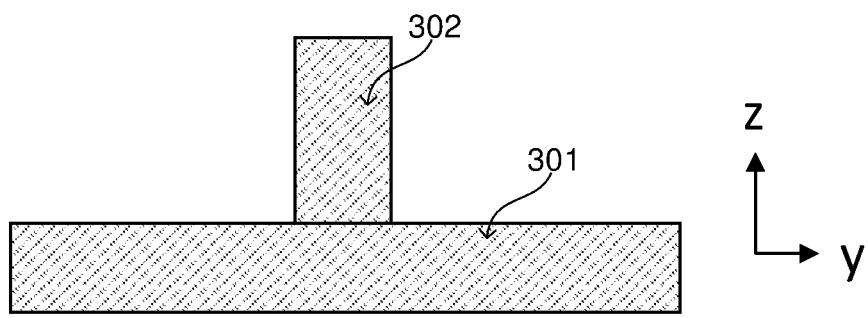
FIG. 3C illustrates a FINFET nanowire from a third angle.

FIGS. 3A-3B depict a Fin Field Effect Transistor, FINFET, nanowire. A FINFET is a type of non-planar or "3D" transistor used in the design of modem processors. FIG. 3A depicts the nanowire as viewed in the x-y plane, FIG. 3B depicts the nanowire as viewed in the x-z plane, FIG. 3C depicts the nanowire as viewed in the y-z plane. The FINFET nanowire comprises a layer 301, upon which a ridge 302 (or 'fin') is situated. The nanowire may be formed of silicon. A 'fin' here may be considered as a FINFET formed in etched bulk silicon, and a 'nanowire' as a silicon fin or wire etched in SOI technology.

Figure 4A:
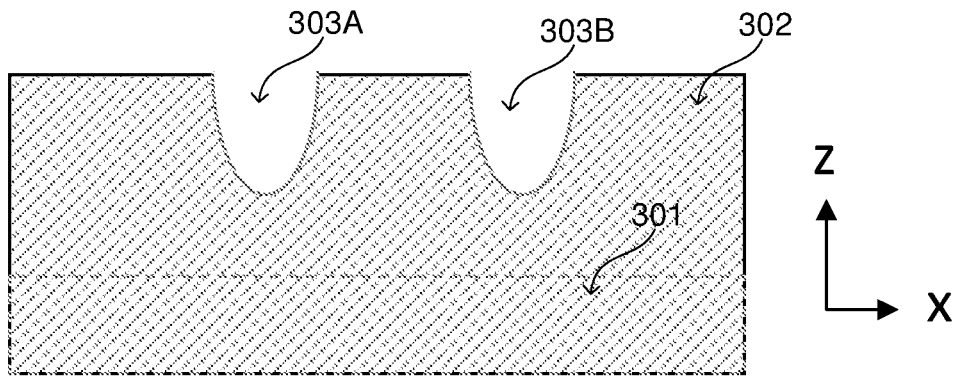
FIG. 4A illustrates a FINFET nanowire having an etched, non-uniform thickness silicon fin.
Figure 4B:
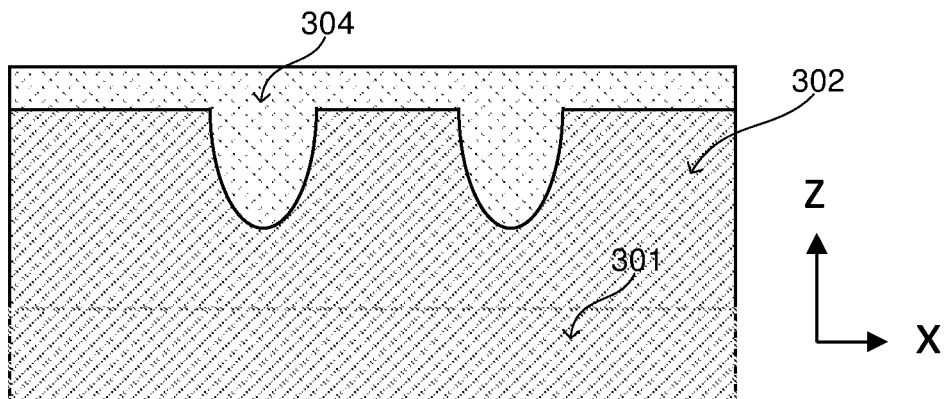
FIG. 4B illustrates the FINFET nanowire of FIG. 4A in which the etched spaces are filled with a dielectric material.
Figure 4C:
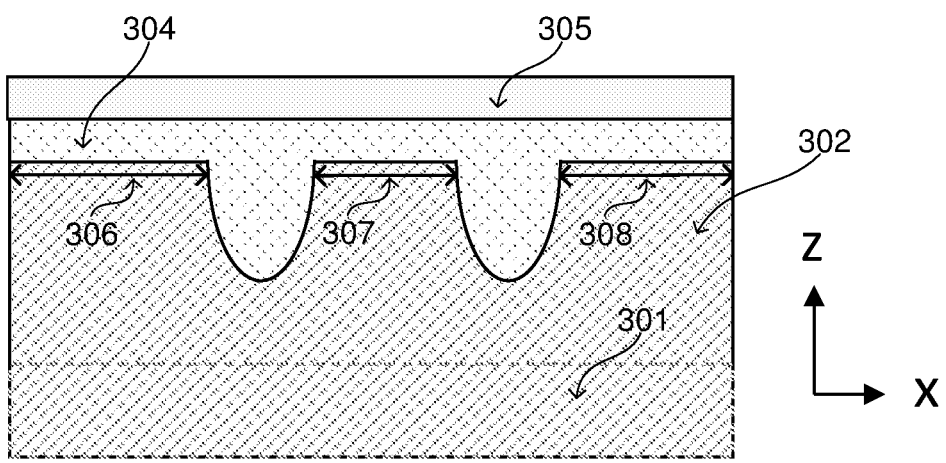
FIG. 4C illustrates a processor element comprising the FINFET nanowire of FIG. 4B and a conductor layer.

The FINFET nanowire of FIGS. 3A-3C may be used as a starting point for producing a processor element. FIGS. 4A-4C depict another example of a processor element formed using a FINFET nanowire. FIG. 4A depicts a nanowire, as described in relation to FIGS. 3A-3C, in which a first trench or channel 303A and a second trench or channel 303B have been etched by removing material from the fin 301 of the nanowire. The etches mean that in this example, the silicon layer 301 is of non-uniform thickness.

FIG. 4B depicts an etched fin, as shown in FIG. 4B, in which at least the first and second trenches have been filled with a dielectric material 304 such as silicon oxide. The structure comprises an etched silicon fin 301, on which there exists a non-uniform layer of dielectric material 304, which is thicker in the regions due to the trenches etched into the fin 301.

FIG. 4C depicts a single electron transistor (SET) formed by depositing a layer of material to form a conducting electrode 305 on the dielectric material 304. The conducting electrode 305 may be formed of polysilicon. A first boundary region 306, a second boundary region 307 and a third boundary region 308 may be defined at the interfaces between the silicon fin 301 and the thin regions of dielectric material 304. As with the embodiments described above in relation to FIGS. 1A-1C and 2A-2C, the non-uniform dielectric layer and the positioning of the electrode 305 define a non-uniform electrostatic potential at the interface between the dielectric material 304 and silicon layer 301. In this way, the confinement region 307 may define a SET island.

A bias potential may be applied to the conducting electrode 305 such that an electric field is produced within the SET. The electric field at the boundary layer between the dielectric layer 304 and the fin 301 will be strongest at the boundary between regions of thin dielectric material and the fin (i.e. the first, second and third boundary regions). The dielectric material acts to reduce the electric field at the boundary between, and within, the silicon fin 301. Therefore, the electric field in the first, second and third boundary regions may be strong enough to induce an inversion layer at the boundary. However, in the regions of the boundary between the first boundary regions 306 and the second boundary region 307 and between the second boundary region 307 and the third boundary region 308 (i.e. the regions proximal to regions of thick dielectric material), the electric field will not be sufficiently strong to induce an inversion layer. The lack of inversion layer in this regions creates a tunnelling barrier for charge carriers within the inversion layer, such that charges within the first boundary region 306 must tunnel in order to reach the second boundary region 307 (similarly, charge carriers must tunnel between the second and third boundary regions).

The potential bias of the conductive electrode may be tuned such that charge carriers may tunnel through the tunnelling barrier from first boundary region 306 to the second boundary region 307. The potential biases may be tuned such that the electric field confines a single electron to the second boundary region 307. The second boundary region can thus be used to define a SET island, or to store a charge carrier for use as a spin qubit.

Figure 5:
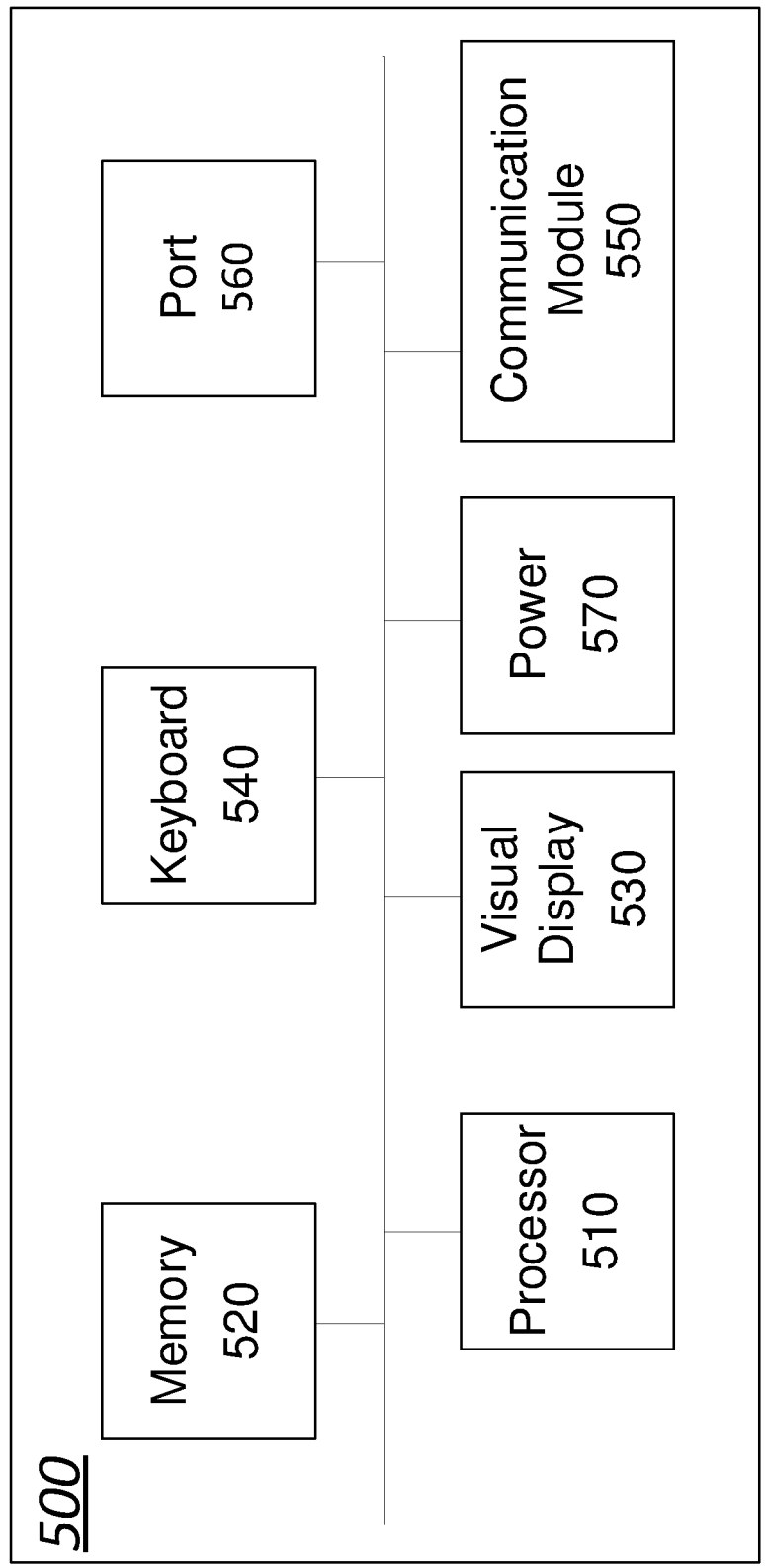
FIG. 5 shows a block diagram of a controller for operating one or more processor elements as described herein.

FIG. 5 is a block diagram of a (classical) controller/computing apparatus 500 for operating a quantum processor comprising one or more processor elements such as processor elements 100 and 200 described above. For example, computing apparatus 500 may comprise a computing device. Computing apparatus 500 may be distributed across multiple connected devices. Other architectures to that shown in FIG. 5 may be used as will be appreciated by the skilled person.

Referring to the figure, controller/computing apparatus 500 includes one or more (classical) processors 510, one or more memories 520, a number of optional user interfaces such as visual display 530 and virtual or physical keyboard 540, a communications module 550, and optionally a port 560 and optionally a power source 570. Each of components 510, 520, 530, 540, 550, 560, and 570 are interconnected using various busses. Classical processor 510 can process instructions for execution within the computing apparatus 500, including instructions stored in memory 520, received via communications module 550, or via port 560.

Memory 520 is for storing data within computing apparatus 500. The one or more memories 520 may include a volatile memory unit or units. The one or more memories may include a non-volatile memory unit or units. The one or more memories 520 may also be another form of computer-readable medium, such as a magnetic or optical disk. One or more memories 520 may provide mass storage for the computing apparatus 500. Instructions for performing a method as described herein may be stored within the one or more memories 520.

The apparatus 500 includes a number of user interfaces including visualising means such as a visual display 530 and a virtual or dedicated user input device such as keyboard 540.

The communications module 550 is suitable for sending and receiving communications between processor 510 and remote systems. For example, communications module 550 may be used to send and receive communications via a communication network such as the Internet.

The port 560 is suitable for receiving, for example, a non-transitory computer readable medium containing instruction to be processed by the processor 510.

The processor 510 is configured to receive data, access the memory 520, and to act upon instructions received either from said memory 520 or a computer-readable storage medium connected to port 560, from communications module 550 or from user input device 540.

With reference to the processor element 100 of FIGS. 1A-1C (although this is equally applicable to the processor element 200 of FIGS. 2A-2C), the classical processor 510 of FIG. 5 is configured to apply a bias potential to the distal end of the conductive via 104A of processor element 100 in order to induce a quantum dot 110 at the interface between the dielectric layer 102C and the silicon layer 106.

The processor 510 is further configured to apply a bias potential to the distal end of the conductive via 104B of processor element 100 in order to induce a second quantum dot 111 at the second interface between the dielectric layer 102D and the silicon layer 106, the second quantum dot 111 for confining one or more electrons or holes in the silicon layer.

The processor 510 may further be configured to apply a voltage between source and drain electrodes of the processor element 100. As described above, the drain-source voltage may be used to read out a logical state of any spin qubit stored in the second quantum dot 111. The processor 510 may further be configured to manipulate a logic state of a qubit confined within the second quantum dot 111 by manipulating a state of electrons or holes confined in the SET island 110.

Variations of the described embodiments are envisaged. For examples, the features of all the disclosed embodiments may be combined in any way.

In many of the examples of processor elements provided above, both a SET and a second quantum dot are provided. The skilled person would appreciate that the techniques and designs described herein could be used to produce a SET alone, or a quantum dot alone.

An array of such processor elements may be formed. For example, a processor may comprise an array of such processor elements.

While silicon dioxide has been mentioned above, the skilled person would appreciate that any suitable dielectric material may be used, for example, Hafnium Oxide.

The first quantum dot and the second quantum dot may be separated by between 10 nm and 140 nm. A typical quantum dot size may be between 1 nm and 100 nm (i.e. sufficiently small to have a single electron in it and spacing between energy levels large enough to make very unlikely thermal occupation of higher energy levels).

It will be appreciated that various methods as described herein, or at least aspects thereof, may be implemented by a computer program. The computer program may include computer code arranged to instruct a computer to cause the performance of the functions of one or more of the various methods described above, for example controlling the manufacturing methods described herein. The computer program and/or the code for performing such methods may be provided to an apparatus, such as a computer, on a computer-readable medium or computer program product. The computer readable medium could be, for example, an electronic, magnetic, optical, electromagnetic, infrared, or semiconductor system, or a propagation medium for data transmission, for example for downloading the code over the Internet. Alternatively, the computer readable medium could take the form of a physical computer readable medium such as a semiconductor or solid state mentor, magnetic tape, a removable diskette, a random access memory (RAM), a read-only memory (ROM), a rigid magnetic disk, and an optical disk, such as a CD-ROM, CD-R/W or DVD.

An apparatus such as a computer may be configured in accordance with such code to perform one or more processes in accordance with the various methods discussed herein. Such an apparatus may take the form of a data processing system. Such a data processing system may be a distributed system. For example, such a data processing system may be distributed across a network.

The above embodiments have been described by way of example only, and the described embodiments are to be considered in all respects only as illustrative and not restrictive. It will be appreciated that variations of the described embodiments may be made without departing from the scope of the invention.

The invention claimed is:

1. A processor element, the processor element comprising:
a silicon layer;
a first conductive electrode;
a second conductive electrode;
a source electrode disposed on the silicon layer;
a drain electrode disposed on the silicon layer; and
dielectric material regions comprising a first region of thin dielectric material, a second region of the thin dielectric material, a third region of the thin dielectric material, a fourth region of the thin dielectric material, and one or more regions of thick dielectric material, such that the dielectric material regions have a non-uniform thickness between the silicon layer and the first and second conductive electrodes, wherein the dielectric material regions disposed at least between the silicon layer and the first and second conductive electrodes;
wherein the first conductive electrode overlies the first, second and third regions of the thin dielectric material and the one or more regions of the thick dielectric material, wherein a first region of the one or more regions of the thick dielectric material laterally separates the first region of the thin dielectric material and the third region of the thin dielectric material, and a second region of the one or more regions of the thick dielectric material laterally separates the third region of the thin dielectric material and the second region of the thin dielectric material;
wherein the second conductive electrode overlies the fourth region of the thin dielectric material, wherein a third region of the one or more regions of the thick dielectric material laterally separates the first conductive electrode and the second conductive electrode;
wherein the processor element is configured such that when a first bias potential is applied to the first conductive electrode:
  a positioning of the first conductive electrode and the non-uniform thickness of the dielectric material regions together define a first electric field profile to induce one or more charge carriers at each of the first, second and third regions of the thin dielectric material at an interface between the silicon layer and the dielectric material regions, wherein the one or more charge carriers are electrons or holes; and
  a first quantum dot is induced at the interface between the silicon layer and the third region of the thin dielectric material, wherein the first quantum dot is separated from the source electrode by a first quantum tunnelling barrier and from the drain electrode by a second quantum tunnelling barrier, and wherein the induced first quantum dot provides a single electron transistor (SET) island;
wherein the processor element is configured such that when a second bias potential is applied to the second conductive electrode, a positioning of the second conductive electrode and the non-uniform thickness of the dielectric material regions together define a second electric field profile to induce a second quantum dot at the interface between the silicon layer and the fourth region of the thin dielectric material;

wherein applying the first bias potential to the first conductive electrode and the second bias potential to the second conductive electrode, in combination with the third region of the one or more regions of the thick dielectric material laterally separating the first conductive electrode and the second conductive electrode result in a quantum tunnelling barrier between the first quantum dot and the second quantum dot, and wherein, under a certain condition, one or more charge carriers are configured to transmit to the second quantum dot only from the first quantum dot through the third region of the one or more regions of the thick dielectric material based on a quantum tunnelling effect.

2. The processor element according to claim 1, wherein the dielectric material regions varies in thickness between a maximum and minimum thickness, wherein the minimum thickness is less than half the maximum thickness and greater than 1 nm.

3. The processor element according to claim 1, wherein the first quantum dot is for confining an electron or a hole for use as a qubit.

4. The processor element according to claim 1, wherein the first and second conductive electrodes comprise gate electrodes; and wherein the induced first quantum dot provides a single electron transistor (SET) island for a SET.

5. The processor element according to claim 1, wherein the second quantum dot is for confining an electron or a hole for use as a qubit.

6. The processor element according to claim 1, wherein the first and second conductive electrodes comprise doped poly-silicon electrodes.

7. A quantum information processor comprising a plurality of processor elements according to claim 1.

8. A processor element, the processor element comprising:
a silicon layer;
a silicon fin overlying the silicon layer, wherein the fin comprises a first trench and a second trench such that the silicon layer has a non-uniform thickness;
a conductive electrode;
dielectric material overlying the silicon layer and filling at least the first and second trenches such that the dielectric material has a non-uniform thickness between the silicon layer and the conductive electrode, the dielectric material disposed at least between the silicon layer and the conductive electrode;
wherein the dielectric material comprises a plurality of thin regions of dielectric material separated by the first and second trenches, wherein a first boundary region, a second boundary region, a third boundary region, and a fourth boundary region are defined at interfaces between the silicon fin and the plurality of thin regions of dielectric material;
wherein the processor element is configured to generate a non-uniform electrostatic potential at an interface between the dielectric material and the silicon layer when a bias potential is applied to the conductive electrode due to a positioning of the conductive electrode and the non-uniform thickness of the dielectric material, so that:
respective one or more charge carriers are induced at each of the first, second and third boundary regions, wherein the respective one or more charge carriers are electrons or holes;
a first tunnelling barrier is generated between the first boundary region and the second boundary region, and a second tunnelling barrier is generated between the second boundary region and the third boundary region, wherein the respective one or more charge carriers are configured to transmit among the first, second, and third boundary regions through the first tunnelling barrier and/or the second tunnelling barrier based on a quantum tunnelling effect, resulting in a first quantum dot at the second boundary region; and
when the bias potential has a particular value, a single electron is confined at the second boundary region so that the second boundary region defines a single electron transistor (SET) island for a SET; and
an additional conductive electrode coupled to the silicon layer via the fourth boundary region and separated from the conductive electrode by a portion of the dielectric material, and wherein, when an additional potential bias applied to the additional conductive electrode has a second particular value, the processor element is configured to generate a second quantum dot by:
generating a third tunnelling barrier between the second boundary region and the fourth boundary region at least in part by the portion of the dielectric material, wherein, under a certain condition, one or more charge carriers are configured to transmit to the second quantum dot only from the first quantum dot through the third tunnelling barrier based on the quantum tunnelling effect.

9. A quantum information processor comprising a plurality of processor elements according to claim 8.

10. A processor element according to claim 8, wherein the dielectric material varies in thickness between a maximum and minimum thickness, wherein the minimum thickness is less than half the maximum thickness and greater than 1 nm.

11. A processor element, the processor element comprising:
a silicon layer;
first dielectric material disposed on the silicon layer;
a first conductive electrode disposed in the first dielectric material and coupled to the silicon layer via a first region, a second region, and a third region of a second dielectric material, wherein the first region is separated from the third region by a first portion of the first dielectric material and the second region is separated from the third region by a second portion of the first dielectric material, and wherein, when a first potential bias applied to the first conductive electrode has a first particular value, the processor element is configured to:
generate a source region of induced charge carriers in the silicon layer under the first region of the second dielectric material, wherein the source region of induced charge carriers is coupled to a source electrode disposed on the silicon layer;
generate a drain region of induced charge carriers in the silicon layer under the second region of the second dielectric material, wherein the drain region of induced charge carriers is coupled to a drain electrode disposed on the silicon layer; and
generate a first quantum dot under the third region of the second dielectric material by:
generating a first quantum tunnelling barrier between the first region and the third region of the second dielectric material at least in part by the first portion of the first dielectric material; and
generating a second quantum tunnelling barrier between the second region and the third region of the second dielectric material at least in part by the second portion of the first dielectric material, wherein one or more charge carriers in the source region of induced charge carriers or the drain region of induced charge carriers are configured to transmit to the first quantum dot through the first quantum tunnelling barrier or the second quantum tunnelling barrier, respectively, based on a quantum tunnelling effect; and a second conductive electrode disposed in the first dielectric material and coupled to the silicon layer via a fourth region of the second dielectric material, wherein the second conductive electrode is separated from the first conductive electrode by a third portion of the first dielectric material, and wherein, when a second potential bias applied to the second conductive electrode has a second particular value, the processor element is configured to:

generate a second quantum dot under the fourth region of the second dielectric material by:

generating a third quantum tunnelling barrier between the second region and the fourth region of the second dielectric material at least in part by the third portion of the first dielectric material, wherein, under a certain condition, one or more charge carriers are configured to transmit to the second quantum dot only from the first quantum dot through the third quantum tunnelling barrier based on the quantum tunnelling effect.

12. The processor element according to claim 11, wherein the first dielectric material varies in thickness and have a maximum thickness, and wherein the first region, the second region, the third region, and the fourth region of the second dielectric material vary in thickness and have a minimum thickness less than half of the maximum thickness and greater than 1 nm.

13. The processor element according to claim 11, wherein the first quantum dot is configured to confine an electron or a hole for use as a qubit.

14. The processor element according to claim 11, wherein the second quantum dot is configured to confine an electron or a hole for use as a qubit.

15. The processor element according to claim 11, wherein the first conductive electrode comprises gate electrodes configured to confine a single electron in the first quantum dot to form a single electron transistor (SET), comprising the source electrode, the first quantum dot, and the drain electrode.

16. The processor element according to claim 11, wherein the first and second conductive electrodes comprise doped poly-silicon electrodes.

* * * * *